United States Patent [19]
Itoh

[11] Patent Number: 5,192,705
[45] Date of Patent: Mar. 9, 1993

[54] METHOD FOR MANUFACTURING SEMICONDUCTOR STACKED CMOS DEVICES

[75] Inventor: Masahiro Itoh, Tokyo, Japan
[73] Assignee: Oki Electric Industry Co., Ltd., Tokyo, Japan
[21] Appl. No.: 711,149
[22] Filed: Jun. 6, 1991

[30] Foreign Application Priority Data

Jun. 13, 1990 [JP] Japan .................................. 2-152720

[51] Int. Cl.$^5$ ...................... H01L 21/70; H01L 27/00
[52] U.S. Cl. ...................................... 437/57; 437/915; 257/69
[58] Field of Search .................. 437/56, 57, 915; 357/42

[56] References Cited

U.S. PATENT DOCUMENTS

| | | | |
|---|---|---|---|
| 4,502,202 | 3/1985 | Malhi ................................ | 437/915 |
| 4,555,721 | 11/1985 | Bansal et al. ...................... | 357/42 |
| 4,628,589 | 12/1986 | Sundaresan ....................... | 437/915 |
| 4,651,408 | 3/1987 | MacElwee et al. ................ | 437/915 |
| 4,656,731 | 4/1987 | Lam et al. ......................... | 437/57 |
| 4,698,659 | 10/1987 | Mizutani ........................... | 357/42 |
| 4,997,785 | 3/1991 | Pfiester ............................. | 437/57 |

OTHER PUBLICATIONS

"Process and Performances comparison of an 8K x 8-bit SCRAM in Three Stacked CMOS Technologies" from IEEE Electron Device Letters, vol. EDL-6 No. 10. Oct. 1985.

Primary Examiner—Olik Chaudhuri
Assistant Examiner—Long Pham
Attorney, Agent, or Firm—Edward D. Manzo

[57] ABSTRACT

A semiconductor stacked CMOS device in which gate electrodes are laid on the upper and lower sides of an upper MOS FET, and a gate oxide film of the upper MOS FET is formed by oxidizing polycrystalline Si film having a low impurity concentration, wherey the current drive capability and the insulative proof-voltage can be enhanced. Further, the polycrystalline Si is formed on a silicon nitride film or a silicon oxide film having a less surface roughness, and accordingly, the lower surface of the polycrystalline Si has also a less surface roughness, whereby it is possible to further enhance the insulative proof-voltage.

10 Claims, 3 Drawing Sheets

METHOD FOR MANUFACTURING SEMICONDUCTOR STACKED CMOS DEVICES

REFERENCE TO RELATED APPLICATIONS

This application claims the right of priority under 35 U.S.C. 119 of Japanese Patent Application No. 02-152720, filed on Jun. 13, 1990, the entire disclosure of which is incorporated herein by reference.

BACKGROUND OF THE INVENTION (1) Field of the Invention

The present invention relates to a semiconductor stacked CMOS device adapted to enhance the insulative proof-voltage of a gate insulation film in a MOS FET and to have a high current drive capability, and also relates to a method of producing thereof.

(2) Description of the Related Art

A conventional stacked CMOS device is, for example, disclosed in the paper "Process and Performance Comparison of an 8k bit SRAM in Three Stacked CMOS Technologies," IEEE ELECTRON DEVICE LETTERS, Vol. 6, No. 10, October, 1985, Pages 548 to 550.

Conventionally, in this kind of CMOS devices, P-type and N-type diffusion layers are formed in a plane on a semiconductor substrate and then an N-channel MOS FET and a P-channel MOS FET are formed, respectively.

However, in recent years, a method has been proposed in which an N-channel MOS FET with a polycrystalline silicon gate electrode is formed, and then a polycrystalline silicon ("Si") layer which acts as a channel area of a P-channel MOS FET is formed through an insulation film.

FIGS. 4(A) and 4(B) show an example of the conventional stacked CMOS structure. In the process of producing this stacked CMOS structure, the gate insulation film of an upper P-channel MOS FET can be obtained by oxidizing the upper surface of a polycrystalline Si gate electrode.

That is, as shown in FIG. 4(A), the upper surface of the polycrystalline Si gate electrode 22 of an N-channel MOS FET on an N-channel in a substrate 21 is oxidized to form a gate insulation film 23, and thereafter, a second polycrystalline Si channel area 24 of a P-channel MOS FET is formed. Then, the side wall structure is removed by anisotropic etching, and a doped oxide film 25 is formed by spin coating.

Next, after a protective oxide film 26 is formed, it is heat-treated, whereby the boron ions doped in the oxide film 25 are diffused in the second polycrystalline Si 24 to form P+ source and drain regions of the P-channel MOS FET.

However, in the above-mentioned conventional stacked CMOS structure, since the polycrystalline Si gate insulation film 23 on the gate electrode 22 contains impurities in a high concentration, the impurities are diffused into the gate insulation film 23, resulting in a detrimental effect upon the insulative proof-voltage and the like.

Further, a surface-roughness depending upon a crystal orientation existing on the surface of the polycrystalline Si also affects the insulative proof-voltage.

Further, there is a problem that since the upper MOS FET is made of polycrystalline Si, a high current drive capability cannot be obtained.

One object of the present invention is to provide a semiconductor stacked CMOS device which includes a gate insulation film immune against an insulation proof-voltage and an upper layer MOS FET with high current drive capability.

Further, another object of the present invention is to provide a method of producing a semiconductor stacked CMOS device which can solve the problem that the insulative proof voltage of polycrystalline Si is lowered by surface roughness depending upon a crystal orientation.

SUMMARY OF THE INVENTION

A first aspect of the present invention is directed to a semiconductor stacked CMOS device comprising source and drain areas formed on a semiconductor substrate and made of a first conductive type diffusion layer; gate oxide films formed on both upper and lower sides of upper and lower portions of polycrystalline Si forming a channel of an upper MOS FET formed on the semiconductor substrate through an insulation film; a gate polycrystalline Si film of a lower MOS FET embedded in the lower side gate oxide film; source and drain areas of the upper MOS FET formed on the polycrystalline Si; and a gate polycrystalline Si film of the upper MOS FET formed in the upper gate oxide film, simultaneously with the gate polycrystalline Si film of the lower MOS FET.

According to a second aspect of the present invention, a method of producing a semiconductor stacked CMOS device comprises the steps of: after forming an active area of a lower MOS FET formed therein with an element isolation area by a LOCOS process being formed on a semiconductor substrate, forming silicon nitride films in portions serving as gate areas of lower and upper MOS FETs or leaving a silicon oxide film on the active area of the lower MOS FET during the element isolation area being formed; forming source and drain areas of the lower MOS FET on the semiconductor substrate; after polycrystalline Si being formed in an active area of the upper MOS FET through an insulation film formed on the semiconductor substrate, removing the silicon nitride film or silicon oxide film; forming a gate oxide film of the lower MOS FET on a lower surface of the polycrystalline Si from which the silicon nitride film or the silicon oxide film has been removed, and simultaneously forming a gate oxide film of the upper MOS FET on an upper surface thereof; and embedding a gate polycrystalline Si film serving as a gate electrode for the lower MOS FET, in the gate film of said lower MOS FET, and simultaneously forming a gate polycrystalline Si film serving as a gate electrode for the upper MOS FET, on the gate oxide film of the upper MOS FET.

With the semiconductor stacked CMOS device having the above-mentioned arrangement according to the first aspect of the present invention, since the gate insulation films are laid on both upper and lower sides of the upper MOS FET and since the gate oxide films of the upper MOS FET are obtained by oxidizing polycrystalline Si having a low impurity concentration, the quantity of impurities introduced into the gate oxide films is less so as not to affect the insulative proof-voltage, whereby it is possible to eliminate the above-mentioned problems.

Further, with the method of producing a semiconductor CMOS device according to the second aspect of the present invention, incorporating the above-mentioned steps, since the gate oxide films are positioned on a silicon nitride film or a silicon oxide film having a less surface roughness, the lower surface of the polycrystalline Si also has less surface roughness so as to obtain a high insulative proof-voltage, thereby to eliminate the above-mentioned problems.

Further, the scope and applicability of the present invention will become apparent from the detailed description and specific examples, while preferred embodiments of the present invention indicated hereinbelow are given by way of illustration only since various changes and modifications within the spirit and scope of the invention will become apparent to those skilled in the art from this detailed description.

BRIEF DESCRIPTION OF THE DRAWINGS

These and other features and advantages of the invention may be more completely understood from the following detailed description of the preferred embodiments of the invention with reference to the accompanying drawings in which.

DETAILED DESCRIPTION OF THE PREFERRED EMBODIMENTS

Figure 1:
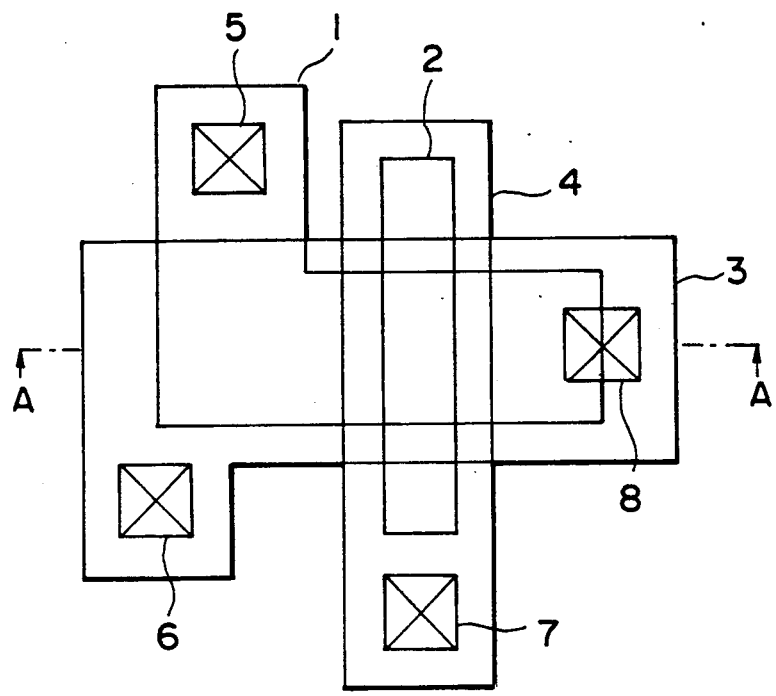
FIG. 1 is a plan view illustrating an embodiment of a semiconductor CMOS device according to the present invention.

Referring first to FIG. 1, a gate area 2 crosses a surface of an active area 1 of a lower MOS FET, and serves as a gate electrode for the upper and lower MOS FETs.

Further, an active area 3 of the upper MOS FET is formed on the active area 1 of the lower MOS FET. Also provided are a contact hole 5 for the lower MOS FET, a contact hole 6 for the upper MOS FET, a contact hole 7 for gate electrodes and a contact hole 8 for the upper and lower MOS FETs in order to receive metal patterns which are not shown. Further, a gate area 4 of the upper MOS FET is formed.

Next, referring mainly to FIGS. 2 and 3, together with FIG. 1, a method of producing the above-mentioned semiconductor CMOS device will be explained in detail.

Figure 3A:
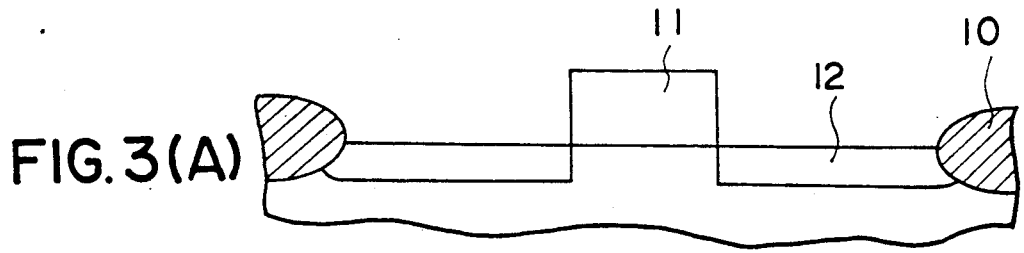
FIGS. 3(A) to 3(D) are sectional views illustrating the semiconductor CMOS device shown in FIG. 1, with which the process of producing the semiconductor CMOS device according to the present invention is explained.

At first, the active area 1 of the lower MOS FET shown in FIG. 1 is formed. In this case, while an element isolation area 10 is formed by a LOCOS process, the active area 1 is formed as shown in FIG. 3(A). (The active area corresponds roughly to the region between isolation areas 10.)

Next, as clearly understood from FIG. 3(A), a silicon nitride film is deposited all over the surface of the semiconductor substrate. Then, the silicon nitride film is removed selectively so as to leave a nitride portion 11 in the area to be used for the gate area of the lower MOS FET and the gate area of the upper MOS FET.

A silicon oxide film remaining on the active area 1 of the lower MOS FET during the performance of the LOCOS process can be substituted instead of the thus deposited silicon nitride film.

Next, an N+ diffusion region 12 in the substrate acting as the source and drain areas of the lower MOS FET is formed by an ion implantation process or the like.

Figure 3B:
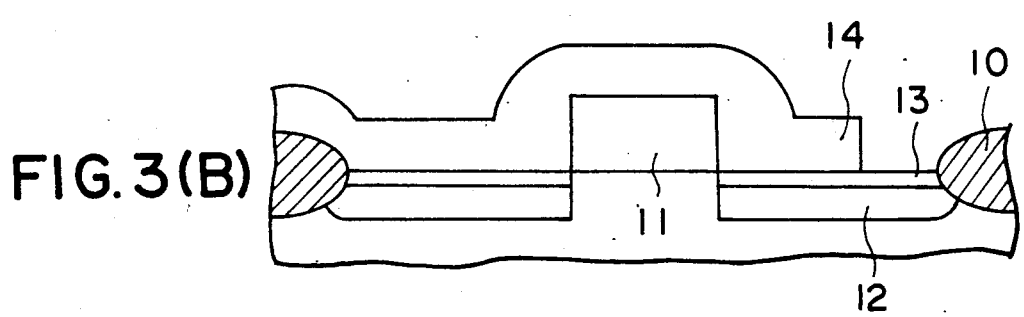

Then, an insulation film 13 is formed on the N+ diffusion layer 12 by a thermal oxidation process, as shown in FIG. 3(B), to isolate the sources and the drains of the upper and lower MOS FETs from each other. After a polycrystalline Si layer or film 14 acting as the active area of the upper MOS FET is deposited all over the surface of the insulation film 13 and silicon nitride film 11, it is subjected to etching to leave the area for the active area 3 of the upper MOS FET. Thus, a P-channel region of the upper MOS FET is formed.

Then, with the use of hot phosphoric acid or the like, the silicon nitride film 11 is removed. At this time, since the hot phosphoric acid enters underneath the active area 3 of the upper MOS FET, all the silicon nitride film 11 on the gate areas can be removed.

Figure 3C:
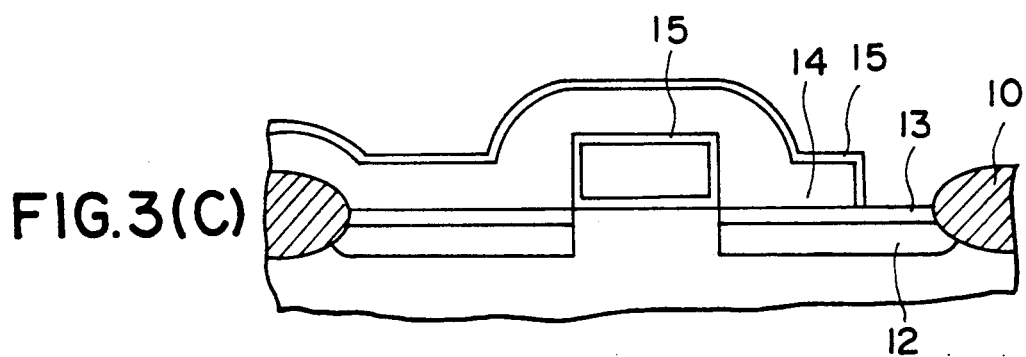

Thereafter, as shown in FIG. 3(C), the gate oxide films 15 forming gate insulation films are formed by a hot oxidation process on the outer (upper) surface of the polycrystalline Si 14 and on the inner surface thereof from which the silicon nitride film was removed.

Figure 3D:
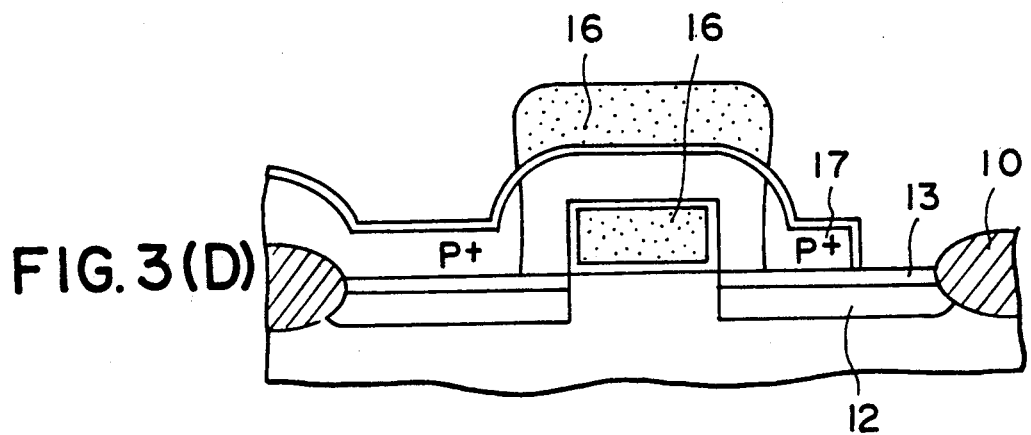
Figure 4A:
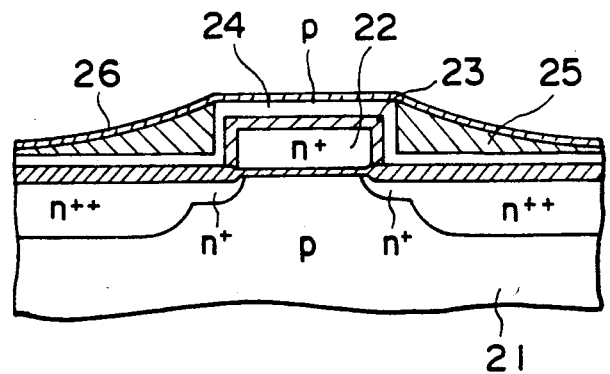
FIGS. 4(A) and 4(B) are sectional views illustrating a conventional semiconductor CMOS device, with which the conventional semiconductor CMOS device is explained.
Figure 4B:
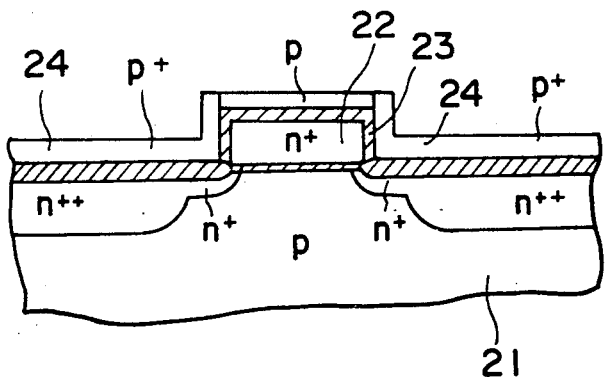

Next, as shown in FIG. 3(D), a gate polycrystalline Si film 16 acting as gate electrodes is formed by an LP (low pressure) CVD process. With the use of the LPCVD process, the polycrystalline Si is formed on a gate area (polycrystalline Si film 16) underneath the active area 3 of the upper MOS FET.

It is considered that introduction of impurities into the polycrystalline Si film 16 is achieved by a process in which impurities are added simultaneously with the formation of the polycrystalline Si film by use of the LPCVD process or by a process in which impurities are added to and diffused over the surface layer of the polycrystalline Si film 16 after formation of a non-doped LPCVD film.

Thereafter, as shown in FIG. 3(D), the Si film is selectively removed so as to leave a gate area of the upper surface of the upper MOS FET. P+ diffusion regions 17 acting as source and drain areas of the upper MOS FET are formed using an ion implantation process or the like.

Figure 2:
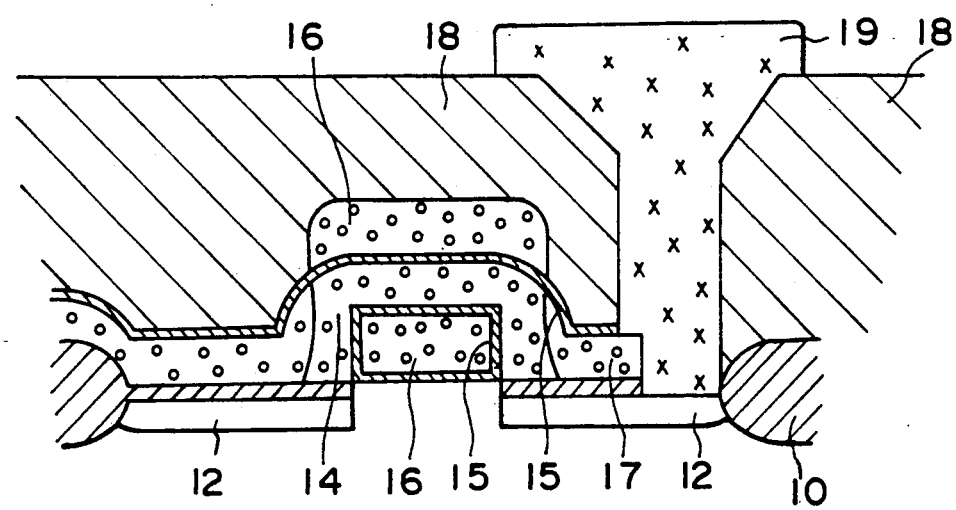
FIG. 2 is a sectional view taken along line A—A in FIG. 1.

Next, as shown in FIG. 2, after an intermediate insulation film 18 is formed all over the surface of the semiconductor substrate, the contact hole 5 for the lower MOS FET, the contact hole 6 for the upper MOS FET, the contact hole 7 for the gate electrodes and the contact hole 8 for the upper and lower MOS FETs are formed as shown in FIG. 1. Then, aluminum electrode 19 is formed in each of the holes.

An explanation has been made of a method of forming an upper P-channel MOS FET and a lower N-channel MOS FET. We note that an upper N-channel MOS FET can be formed. Also, a P-channel MOS FET can be formed by reversing the conductive type of the impurities in the source drain areas and the impurities in the active areas between the upper and lower layer MOS FETs.

As mentioned above, according to the first aspect of the present invention, since gate electrodes are arranged on the upper and lower sides of the upper MOS FET, it is possible to obtain a polycrystalline Si MOS FET having large current drive capability.

Further, since the gate oxide film of the upper MOS FET is formed by oxidizing a polycrystalline Si film having a low impurity concentration, the impurities introduced into the oxide film becomes small, and accordingly, it is possible to enhance the insulative proof-voltage.

According to the second aspect of the present invention in which after a silicon nitride film or a silicon oxide film is formed instead of polycrystalline Si for gate electrodes of the lower MOS FET, the source and drain of the lower MOS FET are formed, and a polycrystalline Si film acting as the channel area of the upper MOS FET is formed. Thereafter, a polycrystalline Si forming the gate electrodes is embedded in a portion where the silicon nitride film or the silicon oxide film is removed underneath the polycrystalline Si film, and simultaneously, a gate insulation film is formed over the channel area of the upper MOS FET. Since the polycrystalline Si is formed on the silicon nitride film or the silicon oxide film with less surface roughness, the lower surface of the polycrystalline Si has also less surface roughness, and it is possible to obtain a high insulative proof-voltage.

What we claim is:

1. A method of manufacturing a stacked CMOS FET with a two layered gate structure comprising the steps of:

(a) forming a first insulating film on a predetermined region of a semiconductor substrate, said region being prepared for a formation of a lower gate electrode;

(b) introducing impurities into said semiconductor substrate using said first insulating film as a mask to form a source region and a drain region of a lower MOS FET;

(c) forming a second insulating film on said source and drain regions;

(d) forming a first conductive film over said first insulating film and said second insulating film;

(e) removing said first insulating film by isotropic wet etching to form a hollow portion, having an exposed inner wall of said first conductive film and an exposed surface of said semiconductor substrate;

(f) subjecting the structure obtained above to a heat treatment to form a gate insulating film on the exposed inner wall of the first conductive film, on an upper surface of said first conductive film, and on the exposed surface of said semiconductor substrate inside said hollow portion;

(g) depositing conductive material on the structure obtained above to form a second conductive film on said gate insulating film and in said hollow region, whereby said hollow region is buried with said second conductive material so as to serve a gate electrode of a lower MOS FET;

(h) patterning said second conductive film on said gate insulating film to form a gate electrode of said upper MOS FET; and (i) introducing impurities into said first conductive film using said gate electrode of said upper MOS FET as a mask to form a source and a drain for said upper MOS FET therein.

2. A method according to claim 1 wherein said first insulating film comprises silicon dioxide.

3. A method according to claim 1 wherein said first insulating film comprises silicon nitride.

4. A method according to claim 1 wherein the source region and the drain region of said upper MOS FET are of a conductivity type opposite to that of said semiconductor substrate.

5. A method according to claim 1 wherein said source region and the drain region of said upper MOS FET are of the same conductivity type as that of said semiconductor substrate.

6. A method according to claim 1 wherein said gate insulating film is a thermally grown silicon oxide film.

7. A method according to claim 1 wherein the impurity introducing process in said steps (b) and (i) is an ion implanting process.

8. A method according to claim 1 wherein said first and second conductive films are formed using a chemical vapor deposition process.

9. A method of producing a semiconductor stacked CMOS device comprising the steps of:

forming an active area of a lower MOS FET and element isolation areas over a semiconductor substrate by a LOCOS process, and forming silicon nitride films in portions serving as gate areas of lower and upper MOS FETs or leaving a silicon oxide film on said active area of the lower MOS FET when said element isolation areas are formed;

forming source and drain areas of said lower MOS FET on said semiconductor substrate;

after a polycrystalline Si region is formed in an active area of the upper MOS FET through an insulation film formed on said semiconductor substrate, removing said silicon nitride film or silicon oxide film;

forming a gate oxide film for the lower MOS FET on a lower surface of the polycrystalline Si from which said silicon nitride film or said silicon oxide film has been removed, and simultaneously forming a gate oxide film for the upper MOS FET on an upper surface thereof; and embedding a gate polycrystalline Si film serving as a gate electrode for the lower MOS FET, in the gate film of said lower layer MOS FET, and simultaneously forming a gate polycrystalline Si film serving as a gate electrode for the upper MOS FET, on the gate oxide film of said upper MOS FET.

10. A method according to claim 1 wherein said first and second conductive films are polycrystalline silicon films.

* * * * *